(12) United States Patent
Kagan

(10) Patent No.: US 7,294,997 B2
(45) Date of Patent: Nov. 13, 2007

(54) ELECTRICAL METER SYSTEM WITH COLOR CODING FEATURES

(75) Inventor: Erran Kagan, Great Neck, NY (US)

(73) Assignee: Electro Industries/Gauge Tech, Westbury, NY (US)

( * ) Notice: Subject to any disclaimer, the term of this patent is extended or adjusted under 35 U.S.C. 154(b) by 0 days.

(21) Appl. No.: 10/896,521

(22) Filed: Jul. 22, 2004

(65) Prior Publication Data

US 2006/0028196 A1    Feb. 9, 2006

(51) Int. Cl.
*G01R 22/00*    (2006.01)

(52) U.S. Cl. .................... 324/142; 324/158.1; 324/107

(58) Field of Classification Search ............ 324/103 R, 324/141–142, 158.1; 439/107, 486, 497, 439/517, 638; 361/364, 370; 702/117
See application file for complete search history.

(56) References Cited

U.S. PATENT DOCUMENTS

| 5,001,420 | A | * | 3/1991 | Germer et al. | ............. 324/142 |
| 5,589,718 | A | * | 12/1996 | Lee | ............. 307/72 |
| 5,900,684 | A | * | 5/1999 | Lam | ............. 307/139 |
| 6,373,238 | B2 | * | 4/2002 | Lewis et al. | ............. 324/107 |
| 6,488,535 | B1 | * | 12/2002 | Robinson et al. | ............. 439/517 |

* cited by examiner

*Primary Examiner*—Vinh P. Nguyen
(74) *Attorney, Agent, or Firm*—Gerald E. Hespos; Anthony J. Casella; Michael J. Porco

(57) ABSTRACT

A communication system between a plurality of electrical loads and at least one electrical measurement device is configured with a plurality of wires grouped in pairs. Each pair of wires is uniquely color coded to facilitate installation of each electrical load.

3 Claims, 2 Drawing Sheets

ELECTRICAL METER SYSTEM WITH COLOR CODING FEATURES

BACKGROUND OF THE INVENTION

1. Field of the Invention

The invention relates generally to electrical metering, and more specifically to an electrical system ergonomically configured to facilitate installation of and provide reliable reading of electrical parameters of a plurality of loads.

2. Description of the Related Art

Currently, various electrical meters are used for high accuracy measurement over a wide frequency bandwidth. Additionally, having a plurality of power consuming loads often requires precise measurements associated with each of these loads. For example, it may be desirable to measure voltage, current, watts, vars, frequency, power, watt-hours, var/hours, demand, harmonics, etc., for each load.

Accordingly, in the conventional art, installation of a system including at least one power meter and multiple loads is typically realized by wiring and connecting each of these loads to the power meter. However, quite often, leads, wires or cables extending between the power meter and multiple loads are tangled or twisted. To discern which pair of wires belongs to the same load is a daunting task even for a seasoned professional. As a result, it is not uncommon to connect voltage and current wires belonging to different loads to the same single terminal pair. In this case, the any reading associated with a load is skewed and the information thus received can lead to serious problems.

Because these electrical meters are often installed in critical applications, shutting a system down to correct for wiring mistakes is often impossible. As a result, the meter ends up reading incorrect data for an extended period of time, e.g., until an entire plant shutdown.

It is, therefore, desirable to provide an installation system that clearly indicates the desired pair of wires belonging to the same load so as to avoid accidental coupling of the voltage and current wires belonging to different loads to the same terminal pair.

SUMMARY OF THE INVENTION

It is, therefore, an object of the present invention to provide a system and method for identifying respective pairs of individual loads being metered in an electrical metering device.

The above and other objectives are attained by an installation system and method in which a plurality of loads, each of which is characterized by a respective pair of uniformly colored wires, are connected to a corresponding input, which is the same color as each pair, of an electrical metering device. As a result, crossing wires from different loads while connecting these loads to an electrical measuring device is minimized.

BRIEF DESCRIPTION OF THE DRAWINGS

The above and other objects, features, and advantages will become more readily apparent from the following detailed description accompanied by the following drawings, in which.

DETAILED DESCRIPTION OF THE INVENTION

Preferred embodiments of the present invention will now be described in detail herein below with reference to the annexed drawings. In the following description, a detailed description of known functions and configurations incorporated herein has been omitted for conciseness.

Figure 1:
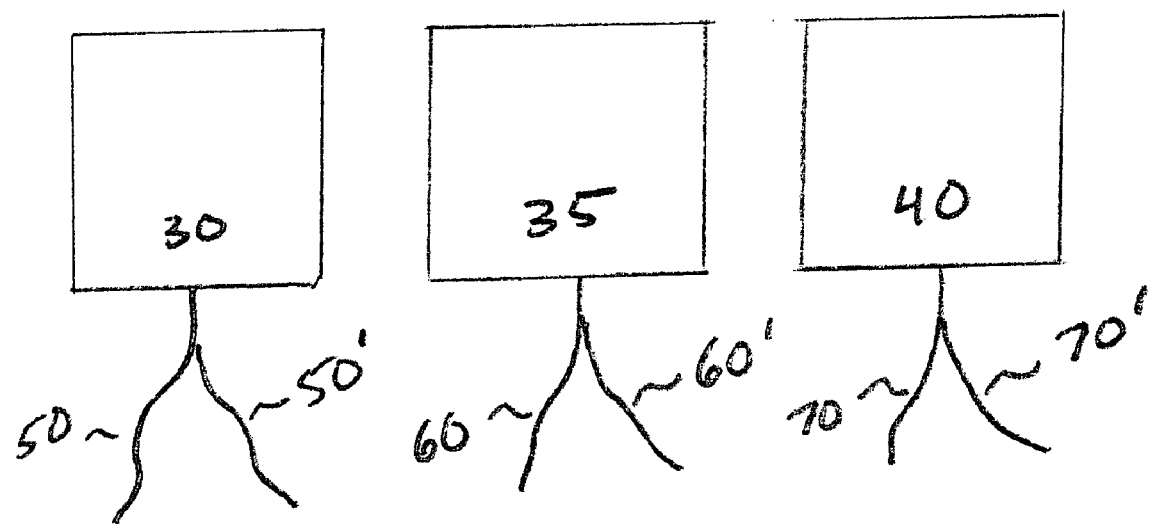
FIG. 1 is block diagram illustrating an inventive installation system including a plurality of loads, each characterized by a pair of current and voltage wires, which are uniquely color coded.
Figure 2:
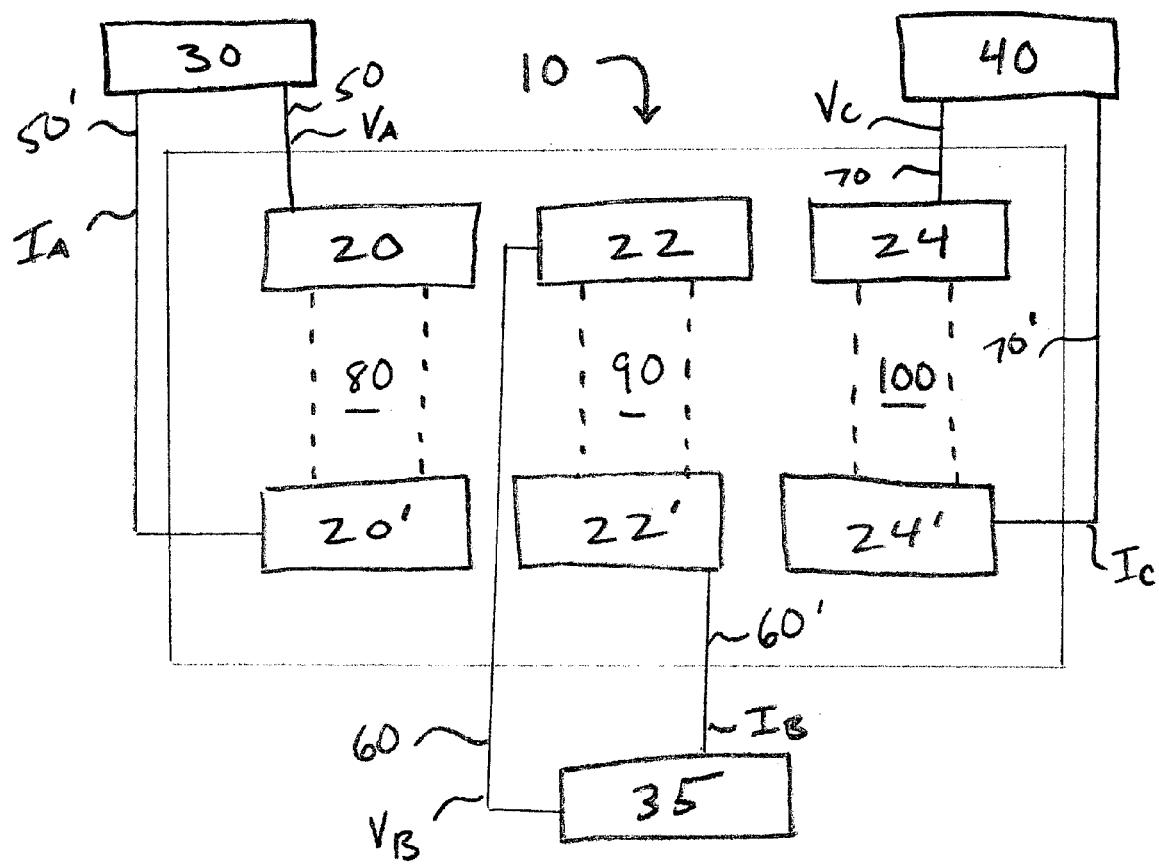
FIG. 2 is a diagrammatic view illustrating one of embodiments of the invention.

FIG. 1 is block diagram illustrating an inventive installation system including a plurality of loads, each characterized by a pair of current and voltage wires, which are uniquely color coded, and FIG. 2 is a diagrammatic view illustrating one of embodiments of the invention.

Referring to FIGS. 1 and 2, an inventive installation system 10 includes a plurality of wires pairs 50 and 50', 60 and 60', and 70 and 70', which extending between loads 30, 35, and 40 and a metering device 10, respectively. Wires 50, 60, and 70 each correspond to the voltage of their respective pairs, and wires 50', 60', and 70' each correspond to the current of their respective pairs. Further, to avoid crossing the voltage and current wires from different loads, each wire pair 50 and 50', 60 and 60', and 70 and 70' are uniquely color-coded. That is, for example, wires 50 and 50' are red, wires 60 and 60' are blue, and wires 70 and 70' are yellow. As a result, regardless of the overall number of loads, the risk of crossing the voltage and current wires from different loads is substantially minimized since two wires of the same pair is identically color-coded.

For example, to determine the power associated with each of the loads, it is necessary that a voltage and current of each load be measured. Accordingly, by using the colored wire pairs according to the present invention, the chances of obtaining an incorrect power reading, which is normally caused by calculating a power using, for example, wires 50 and 60', are greatly reduced.

Additionally, to even further minimize the risk of crossing wires, according to another preferred embodiment of the present invention, the metering device 10 is configured such that the terminals for receiving the respective wire pairs are also identified by the same colored as the corresponding wire pair.

Referring to FIG. 2, as indicated above, such a color-coding of the terminals may be realized, for example, by having a region between the terminals of the same pair colored in red, blue, and yellow. More specifically, the metering device 10 comprises voltage terminals 20, 22, and 24, current terminals 20', 22', and 24'. Further, a region 80, which is between terminals 20 and 20' is red, a region 90 between the terminals 22 and 22' is blue, and a region 100 between the terminals 24 and 24' yellow. Understandably, these colors are given only as an example and can vary.

Accordingly, during installation the wires pairs 50 and 50', 60 and 60', and 70 and 70', from the loads 30, 35 and 40, respectively, are connected to the matching voltage and current terminal pairs 20 and 20', 22 and 22', 24 and 24', respectively. Further, this is easily accomplished as wires pair 50 and 50' and the corresponding terminal pair 20 and 20', which are identified by area 80, are red, wires pair 60 and 60' and the corresponding terminal pair 22 and 22', which are identified by area 90, are blue, and wires pair 70 and 70' and the corresponding terminal pair 24 and 24', which are identified by area 100, are yellow.

Accordingly, the present invention provides a system and method, which uses color-coding to identify wire pairs and their respective terminals in order to facilitate installation and prevent metering errors caused by crossing wire pairs.

While the present invention has been shown and described with reference to certain preferred embodiments thereof, it will be understood by those skilled in the art that various changes in form and details, may be made therein without departing from the spirit and scope of the present invention. For example, the present invention, although illustrated with three loads and different wire pairs can be applied to any number of loads and wire pairs. Further, the number of wire associated with each load may also vary.

What is claimed is:

1. A power measuring system comprising:

at least first, second and third electrical loads;

at least first, second and third pairs of wires associated respectively with the first, second and third loads, the wires in the first pair being of a first color, the wires in the second pair being of a second color and the wires in the third pair being of a third color, the first, second and third colors being different from one another so that the respective pairs of wires are color coded for distinguishing the respective first, second and third loads; and an electrical metering device operative to measure a voltage and a current associated with each of the electrical loads, the electrical loads being external to the electrical metering device, the electrical metering device having at least first, second and third voltage input terminals and at least first, second and third current input terminals disposed on the electrical metering device so that the first, second and third current input terminal are associated respectively with one of said first, second and third voltage input terminals for defining first, second and third input terminal pairs, the voltage input terminal in each of said input terminal pairs being spaced from the associated current input terminal in the respective pair, the electrical metering device further having first, second and third colored regions formed between each of said respective pair of one of said voltage terminal and one of an associated current terminal and corresponding to the respective first, second and third colors of the wires, the first colored region being disposed on the electrical metering device to extend between the first voltage input terminal and the first current input terminal, the second colored region being disposed on the electrical metering device to extend between the second voltage input terminal and the second current input terminal and the third colored region being disposed on the electrical metering device to extend between the third voltage input terminal and the third current input terminal, whereby the first, second and third colored regions of the electrical metering device enable the wires of the respective first, second and third pairs of wires to be connected with a specified one of the first, second and third input terminal pairs for accurately measuring the voltage and the current for each of the first, second and third electrical loads.

2. The power measuring system of claim 1, wherein the first, second and third voltage terminals of the electrical metering device are substantially equally spaced in a linear array on the electrical metering device, and wherein the first, second and third current terminals are substantially equally spaced in a linear array on the electrical metering device, the linear array of current terminals being opposed to and parallel to the liner array of voltage terminals so that the first, second and third current terminals are substantially opposed respectively to the first, second and third voltage terminals, the first, second and third colored regions of the electrical metering device extending substantially perpendicularly between the substantially linear array of voltage terminals and the substantially linear array of current terminals for coloring the terminal pair for each of the respective pairs of wires.

3. A power measuring system for providing reliable reading of electrical parameters of a plurality of electrical loads, comprising: an electrical metering device connected to each of the loads and operative to measure the electrical parameters associated with each of the loads, the electrical metering device having a plurality of voltage terminals disposed on the metering device and associated respectively with each of the plurality of loads, a plurality of current terminals disposed on the metering device and associated respectively with each of the plurality of loads, so that the voltage terminals and the current terminals define terminal pairs on the electrical metering device and associated respectively with each of the plurality of loads, the voltage terminals on the metering device being spaced from the current terminals on the metering device, at least one colored region being disposed on the metering device extending between and linking a respective pair of voltage terminals and current terminals, wherein the at least one color coded region identifies a terminal pair for an associated load, wherein each of the at least one colored region being of a different color for each terminal pair.

* * * * *